(12) United States Patent
Kuo et al.

(10) Patent No.: US 8,809,946 B2
(45) Date of Patent: Aug. 19, 2014

(54) WIDE TRENCH TERMINATION STRUCTURE FOR SEMICONDUCTOR DEVICE

(71) Applicant: PFC Device Corp., New Taipei (TW)

(72) Inventors: Hung-Hsin Kuo, New Taipei (TW); Mei-Ling Chen, New Taipei (TW); Kuo-Liang Chao, New Taipei (TW)

(73) Assignee: PFC Device Corp., New Taipei (TW)

( * ) Notice: Subject to any disclaimer, the term of this patent is extended or adjusted under 35 U.S.C. 154(b) by 0 days.

(21) Appl. No.: 13/737,540

(22) Filed: Jan. 9, 2013

(65) Prior Publication Data

US 2013/0249043 A1   Sep. 26, 2013

(30) Foreign Application Priority Data

Mar. 21, 2012   (TW) .............. 101109602 A

(51) Int. Cl.
*H01L 29/66* (2006.01)
*H01L 29/06* (2006.01)
*H01L 29/40* (2006.01)
*H01L 29/861* (2006.01)
*H01L 29/78* (2006.01)
*H01L 29/872* (2006.01)

(52) U.S. Cl.
CPC ......... *H01L 29/0649* (2013.01); *H01L 29/7811* (2013.01); *H01L 29/7813* (2013.01); *H01L 29/0661* (2013.01); *H01L 29/872* (2013.01); *H01L 29/6609* (2013.01); *H01L 29/407* (2013.01); *H01L 29/861* (2013.01)
USPC ........................................... 257/330; 257/368

(58) Field of Classification Search
None
See application file for complete search history.

(56) References Cited

U.S. PATENT DOCUMENTS

| | | |
|---|---|---|
| 6,624,030 B2 | 9/2003 | Chang et al. |
| 6,940,145 B2 * | 9/2005 | Blair et al. ............... 257/510 |
| 2006/0035422 A1 * | 2/2006 | He et al. ................... 438/167 |

* cited by examiner

*Primary Examiner* — Julio J Maldonado
*Assistant Examiner* — Joseph Galvin, III
(74) *Attorney, Agent, or Firm* — Muncy, Geissler, Olds & Lowe, P.C.

(57) ABSTRACT

A wide trench termination structure for semiconductor device includes a wide trench structure defined on a semiconductor substrate and having a width larger than that of narrow trench structures on an active region of the semiconductor device, an oxide layer arranged on an inner face of the wide trench structure, at least one trench polysilicon layer arranged on the oxide layer and on inner sidewall of the wide trench structure, a metal layer arranged on the oxide layer not covered by the trench polysilicon layer and on the trench polysilicon layer, and a field oxide layer arranged on the semiconductor substrate and outside the wide trench structure.

10 Claims, 19 Drawing Sheets

WIDE TRENCH TERMINATION STRUCTURE FOR SEMICONDUCTOR DEVICE

This application is based on and claims the benefit of Taiwan Application No. 101109602 filed Mar. 21, 2012 the entire disclosure of which is incorporated by reference herein.

BACKGROUND OF THE INVENTION

1. Field of the Invention

The present invention relates to a termination structure for semiconductor device, especially to a wide trench termination structure for semiconductor device to render the semiconductor device with enhanced reverse voltage tolerance.

2. Description of Prior Art

A Schottky diode is a unipolar device using electrons as carriers, and it is characterized with high switching speed and low forward voltage drop. The limitations of Schottky diodes are the relatively low reverse voltage tolerance and the relatively high reverse leakage current. The limitations are related to the Schottky barrier determined by the metal work function of the metal electrode, the band gap of the intrinsic semiconductor, the type and concentration of dopants in the semiconductor layer, and other factors. In contrast to the Schottky diode, a P-N junction diode is a bipolar device that can pass more current than the Schottky diode. However, the P-N junction diode has a forward voltage drop higher than that of the Schottky diode, and takes longer reverse recovery time due to a slow and random recombination of electrons and holes during the recovery period.

For combining the benefits of the Schottky diode and the P-N junction diode, a configuration of a gated diode device has been disclosed. In the gated diode, the equi-potential gate and source electrodes of a planar MOSFET are served as the anode, and the drain electrode at the backside of the wafer is served as the cathode. The gated diode device has comparable or lower forward voltage drop with respect to the Schottky diode. The reverse leakage current of the gated diode device is similar to that of the P-N junction diode, but is lower than that of the Schottky diode. The reverse recovery time at high temperature of the gated diode device is similar to that of the Schottky diode. The interface tolerance temperature of the gated diode device is higher than that of the Schottky diode. In practical applications, the gated diode device is advantageous over the Schottky diode.

A typical gated diode device has been disclosed in U.S. Pat. No. 6,624,030, which is entitled "RECTIFIER DEVICE HAVING A LATERALLY GRADED P-N JUNCTION FOR A CHANNEL REGION". Please refer to FIGS. 1A~1I, which schematically illustrate a method of manufacturing a gated diode device. Firstly, as shown in FIG. 1A, an N+ substrate 20 with an N– epitaxial layer 22 grown thereon is provided, wherein a field oxide layer 50 is grown on the surface of the N– epitaxial layer 22. Then, as shown in FIG. 1B, a photoresist layer 52 is formed on the field oxide layer 50. A first photolithography and etching process is performed to partially remove the field oxide layer 50. Then, a first ion-implanting process is performed to dope the substrate with a P-type dopant (e.g. boron) through openings in the photoresist layer 52. Then, a boron thermal drive-in process is perform to form edge P-doped structures 28 and a center P-doped structure 30 (FIG. 1C). Then, a second ion-implanting process is performed to dope the substrate with BF2. Then, a second photolithography and etching process is performed to use a photoresist layer 54 to cover the periphery of the device region and remove the field oxide layer 50 in the center of the device region (FIG. 1D and FIG. 1E). As shown in FIG. 1F, a gate silicon oxide layer 56, a polysilicon layer 58 and a silicon nitride layer 60 are sequentially grown, and an arsenic implantation process is made. Then, as shown in FIG. 1G, an oxide layer 62 is formed by chemical vapor deposition. Then, a third photolithography and etching process is performed to form a gate-pattern photoresist layer 64 over the oxide layer 62.

Afterward, a wet etching process is performed to etch the oxide layer 62 while leaving the oxide layer 62 under the gate-pattern photoresist layer 64 (FIG. 1H). Then, a dry etching process is performed to partially remove the silicon nitride layer 60, and a third ion-implanting process is performed to dope the substrate with boron ion (FIG. 1I). Then, the remaining photoresist layer 64 is removed, and a fourth ion-implanting process is performed to dope the substrate with boron ion to form a P-type pocket 36 (FIG. 1J). Then, a wet etching process is performed to remove the silicon oxide layer 62, and a dry etching process is performed to partially remove the polysilicon layer 58 (FIG. 1K). Then, an arsenic implantation process is made to form an N-doped source/drain region 24, a wet etching process is performed to remove the silicon nitride layer 60, and an arsenic implantation process is made (FIG. 1L). Meanwhile, some fabricating steps of the gated diode device have been done. After subsequent steps (e.g. metal layer formation, photolithography and etching process, and so on) are carried out, the front-end process is completed.

In comparison with the Schottky diode, the gated diode device fabricated by the above method has comparable forward voltage drop, lower reverse leakage current, higher interface tolerance temperature, better reliability result and longer reverse recovery time (at the room temperature).

However, the above-mentioned gated diode device has limited application because it has junction breakdown at high reverse voltage.

SUMMARY OF THE INVENTION

Accordingly, one object of the present invention is to provide a wide trench termination structure for semiconductor device to render the semiconductor device with enhanced reverse voltage tolerance.

According to one aspect of the present invention, the present invention provides a wide trench termination structure for semiconductor device. The semiconductor device comprises a semiconductor substrate, a device region and the wide trench termination structure. The device region comprises a plurality of narrow trenches. The wide trench termination structure comprising: a wide trench defined on the semiconductor substrate and a width of the wide trench being larger than a width of the narrow trench; an oxide layer formed on inner face of the wide trench; at least one trench polysilicon layer formed outer face of the oxide layer and corresponding to inner side face of the wide trench; a metal layer formed on the oxide layer not covered by the trench polysilicon layer and on the trench polysilicon layer, and a field oxide layer structure arranged on the semiconductor substrate and outside the wide trench structure.

According to another aspect of the present invention, the present invention provides a wide trench termination structure for semiconductor device. The semiconductor device comprises a semiconductor substrate, a device region and the wide trench termination structure. The device region comprises a plurality of narrow trenches. The wide trench termination structure comprising: a wide trench defined on the semiconductor substrate and a width of the wide trench being larger than a width of the narrow trench; a thermal oxide layer formed on an inner face of the wide trench; a tetraethoxysilane (TEOS) oxide layer formed on the thermal oxide layer; a metal layer arranged on the TEOS oxide layer, and a field oxide layer structure arranged on the semiconductor substrate and outside the wide trench structure.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1A:
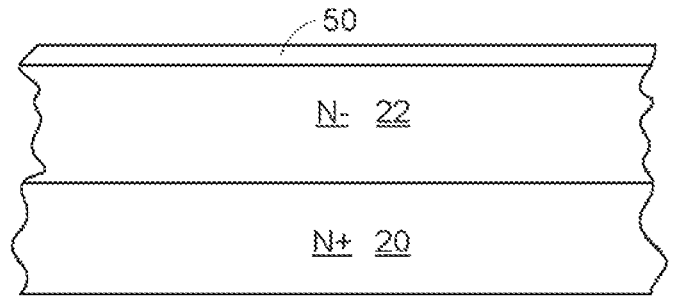
FIGS. 1A~1L schematically illustrate a prior art method of manufacturing a gated diode device.
Figure 1B:
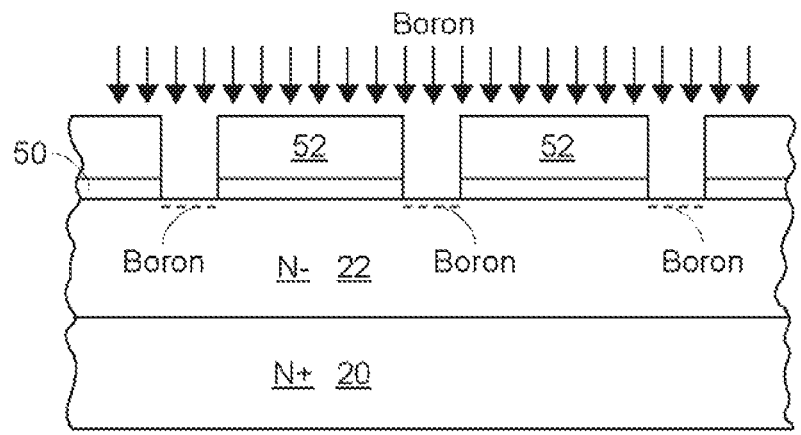
Figure 1C:
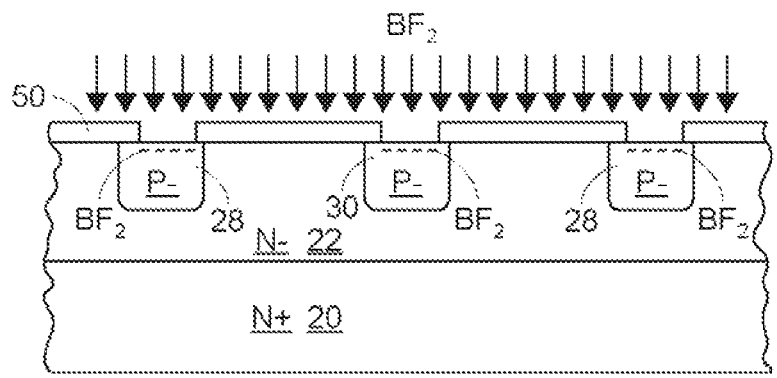
Figure 1D:
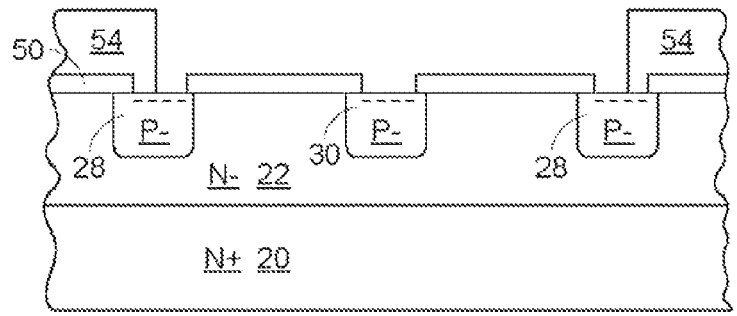
Figure 1E:
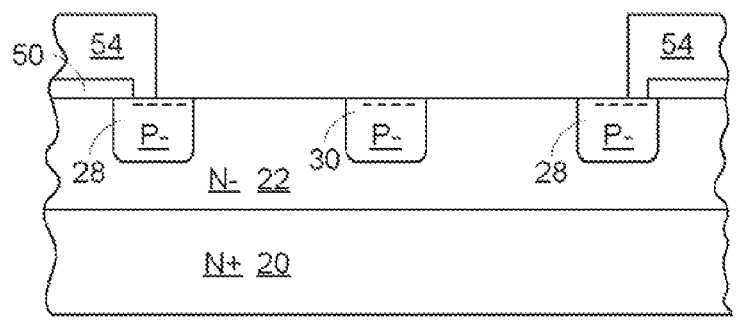
Figure 1F:
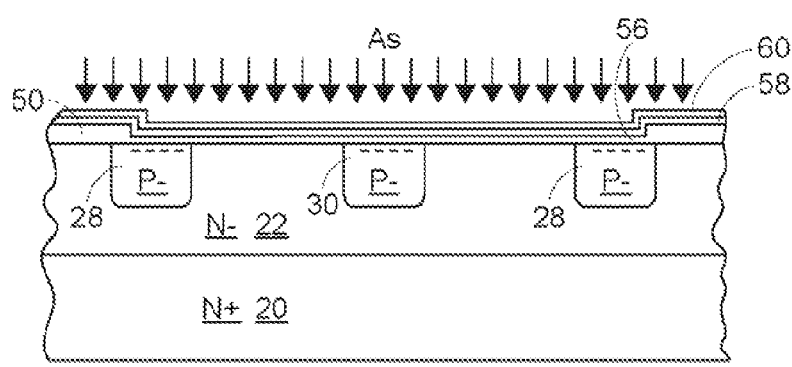
Figure 1G:
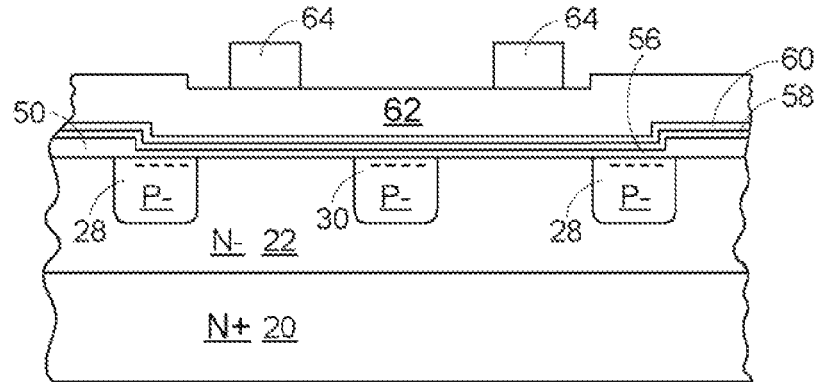
Figure 1H:
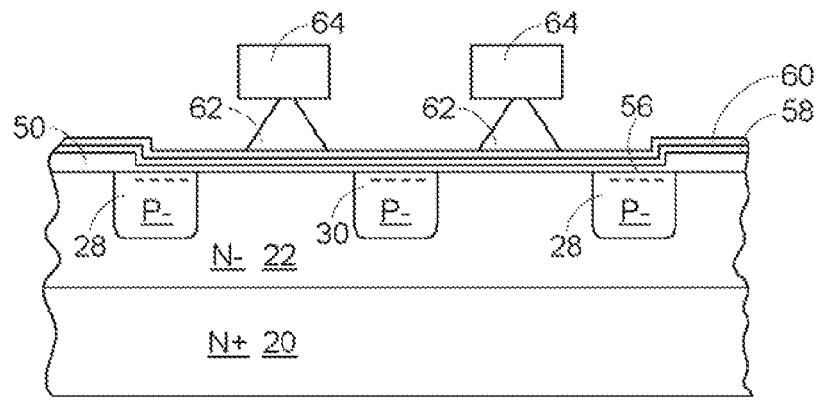
Figure 1I:
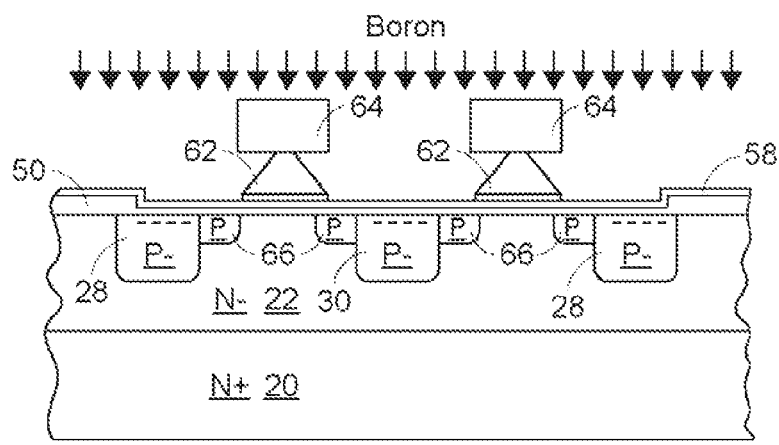
Figure 1J:
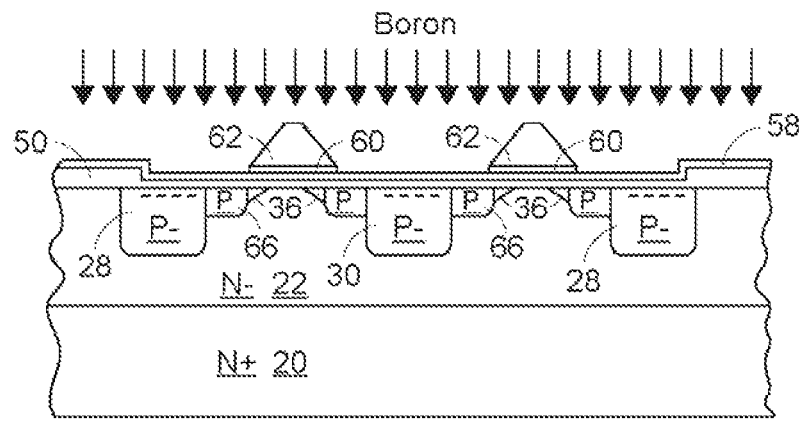
Figure 1K:
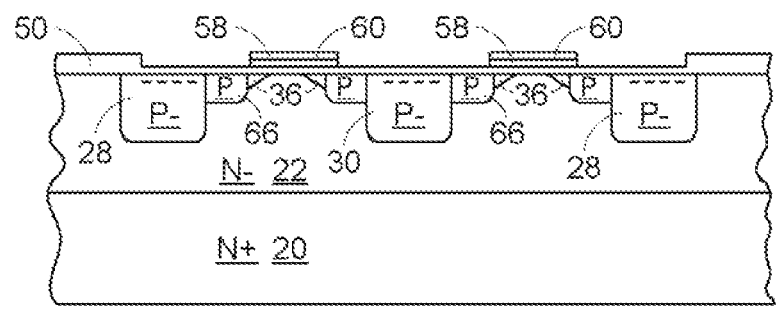
Figure 1L:
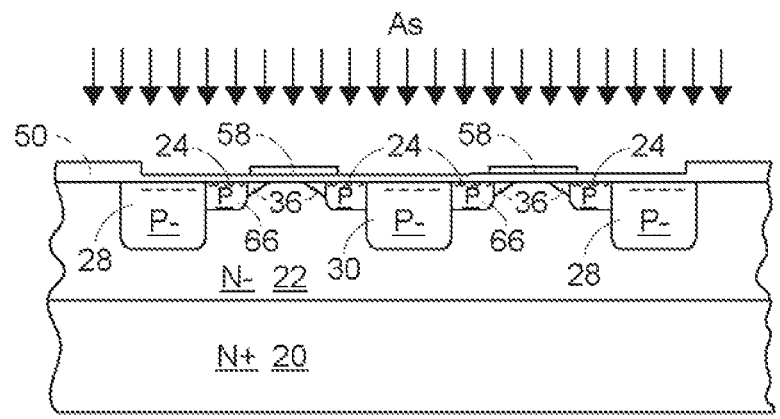
Figure 2A:
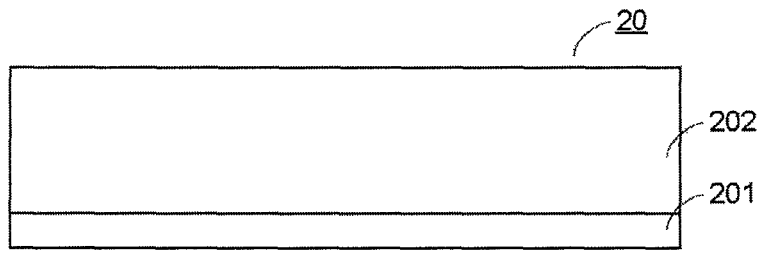
FIGS. 2A~2R schematically illustrate a method of manufacturing a semiconductor device with wide trench termination structure according to a first embodiment of the present invention.
Figure 2B:
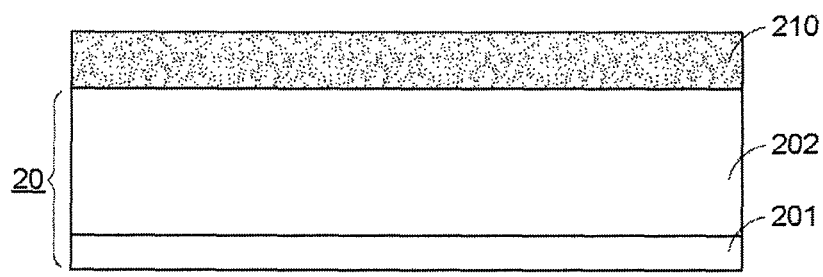
Figure 2C:
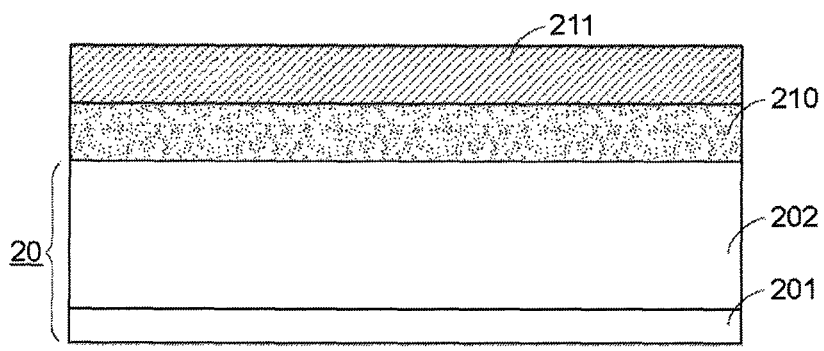
Figure 2D:
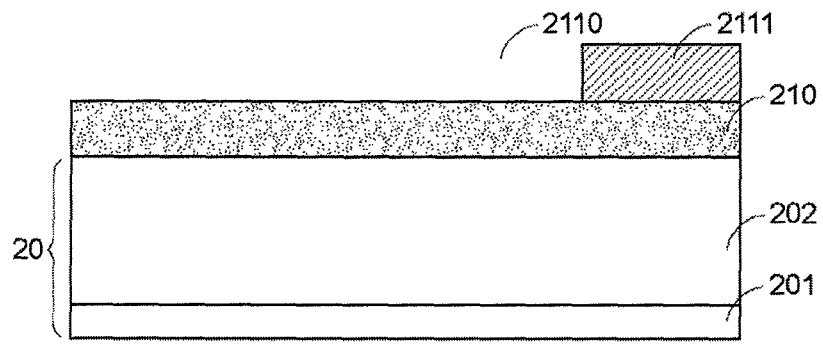
Figure 2E:
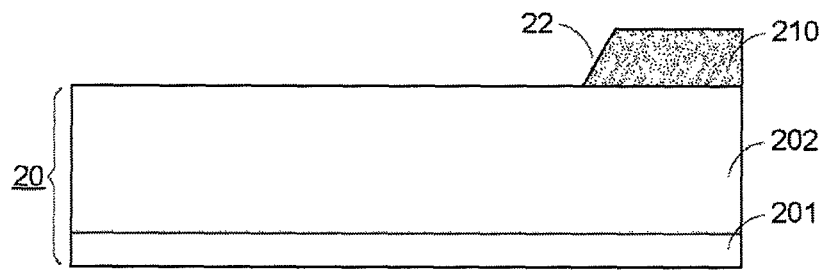
Figure 2F:
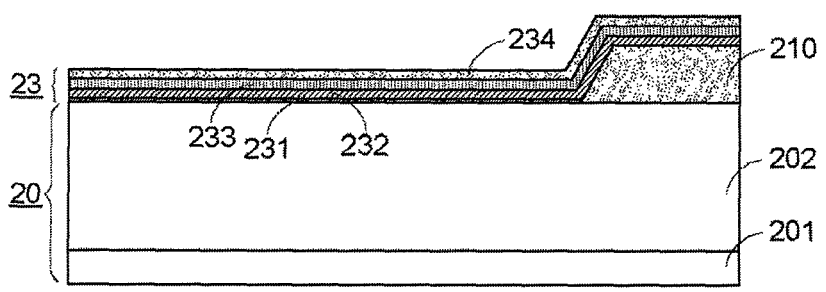
Figure 2G:
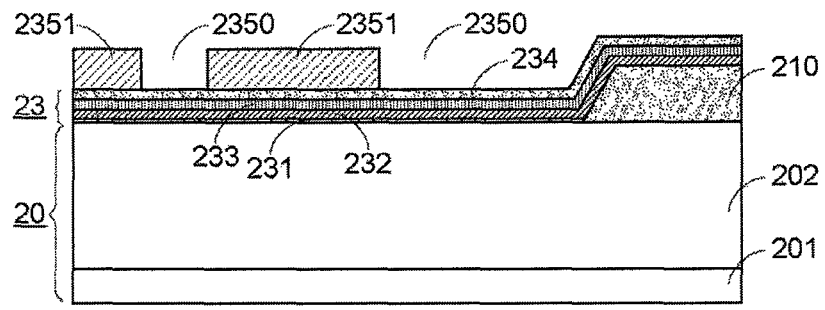
Figure 2H:
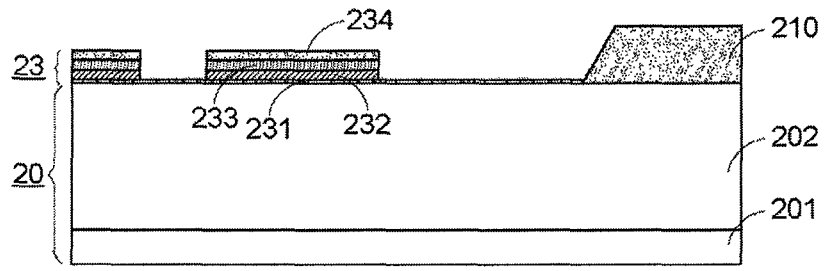
Figure 2I:
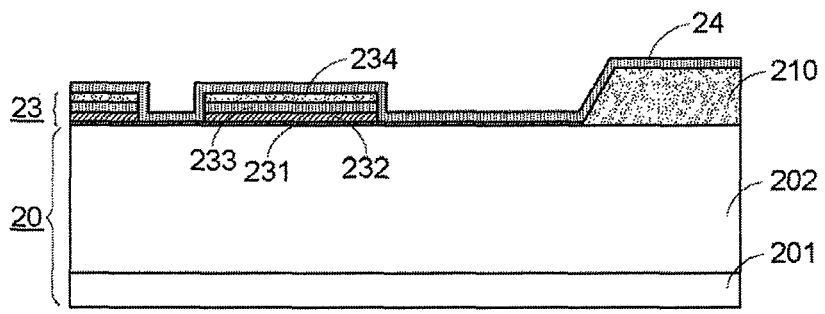
Figure 2J:
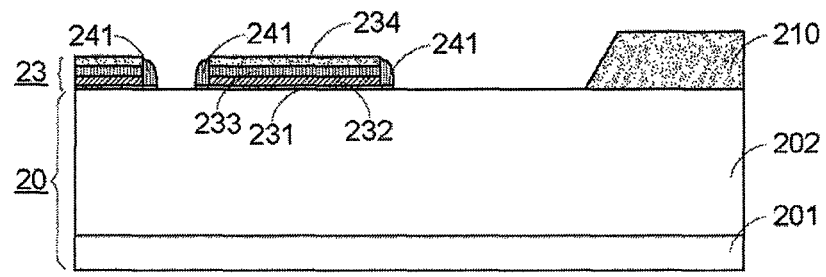
Figure 2K:
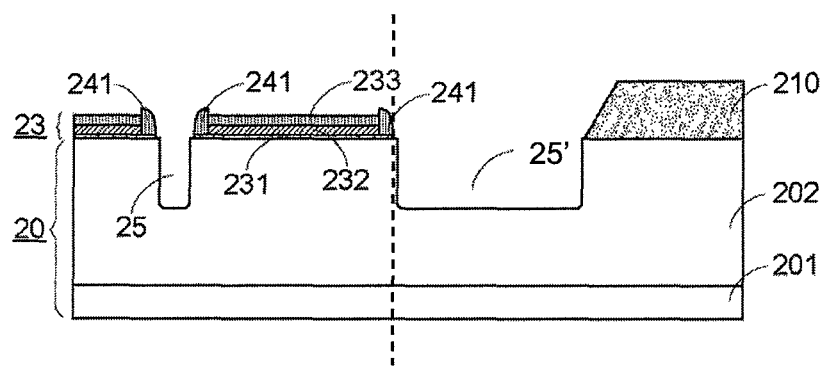
Figure 2L:
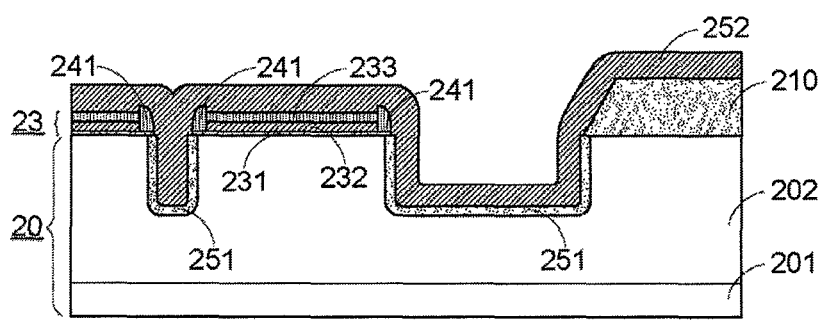
Figure 2M:
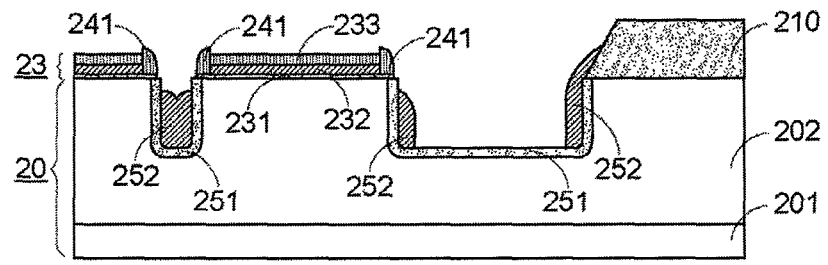
Figure 2N:
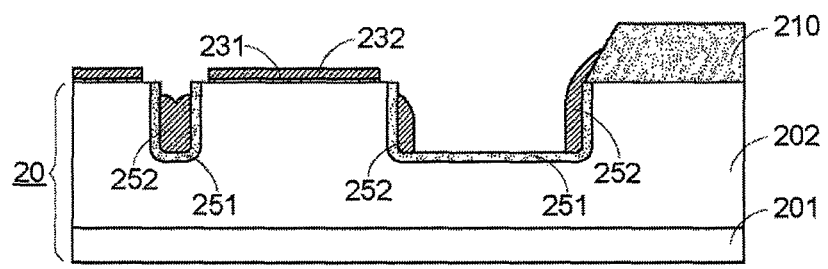
Figure 2O:
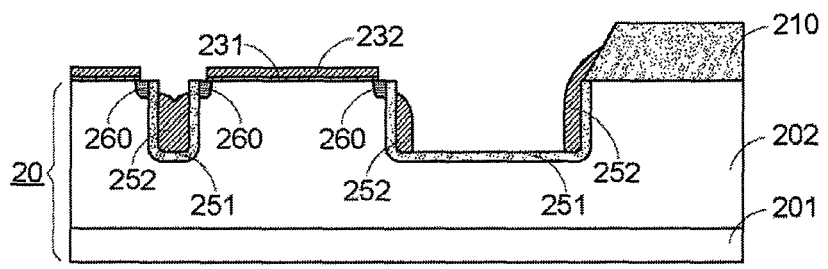
Figure 2P:
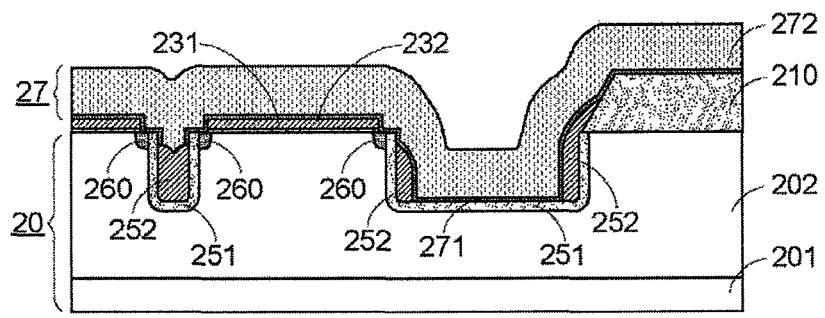
Figure 2Q:
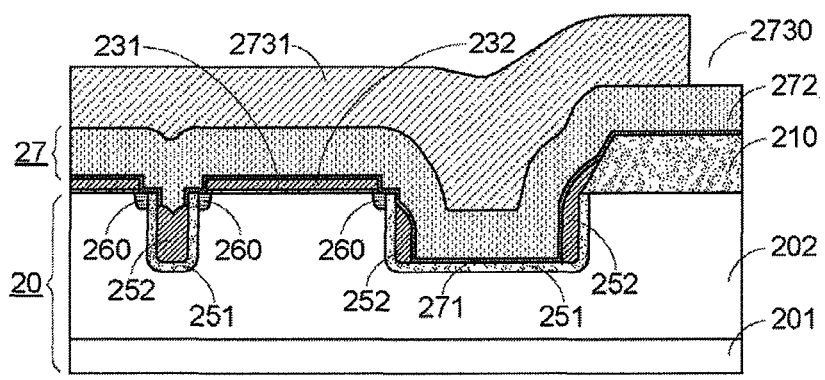
Figure 2R:
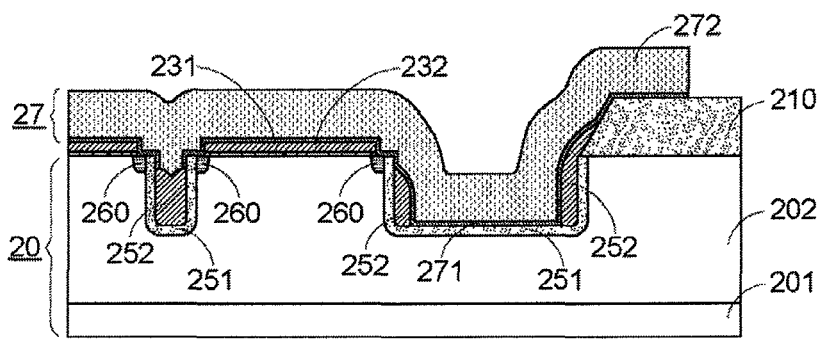

Please refer to FIGS. 2A~2R, which schematically illustrate a method of manufacturing a semiconductor device with wide trench termination structure according to a first embodiment of the present invention. The semiconductor device is exemplified with MOS (metal-oxide-semiconductor) PN junction diode. However, it should be noted that the wide trench termination structure of the present invention can also be applied to other semiconductor devices, such as Schottky diode, MOSFET device, or IGBT (Insulated Gate Bipolar Transistor), demanding termination structure. Therefore, the scope of the disclosure is not limited by the specific example.

Firstly, as shown in FIG. 2A, a semiconductor substrate 20 with a heavily-doped N-type silicon layer 201 (N+ silicon layer) and a lightly-doped N-type epitaxial layer 202 (N-epitaxial layer) is provided. Then, as shown in FIG. 2B, a first mask layer 210 (a field oxide layer, and can also be referred to as a field oxide layer structure in later description) is grown on the substrate 20 by thermal oxidation process. Then, a photoresist layer 211 is formed on the first mask layer 210 (FIG. 2C). A first photolithography process is performed to define a patterned photoresist zone 2111 and a photoresist-free zone 2110 on the photoresist layer 211 (FIG. 2D). An etching process is performed to remove a portion of the first mask layer 210, which is uncovered by the patterned photoresist zone 2111. After the remaining patterned photoresist zone 2111 is removed, an oxide sidewall structure 22 is formed on the substrate 20 (FIG. 2E).

Then, a second mask layer 23 is grown on the semiconductor substrate 20 and the oxide sidewall structure 22 (namely, the remaining portion of the first mask layer 210). The second mask layer 23 is formed by growing a gate oxide layer 231 on the substrate 20, and sequentially growing a polysilicon layer 232, a silicon nitride layer 233 and an oxide layer 234 on the substrate 20, the sidewall structure 22 and the first mask layer 210 (see FIG. 2F). A second photolithography process is performed to define a patterned photoresist zone 2351 and a photoresist-free zone 2350 over the second mask layer 23 (FIG. 2G). After an etching process is performed to remove a portion of the oxide layer 234, the silicon nitride layer 233 and the polysilicon layer 232 of the second mask layer 23, which is not covered by the patterned photoresist zone 2351, the remaining patterned photoresist zone 2351 is removed (FIG. 2H).

Then, as shown in FIG. 2I, a third mask layer 24 (e.g. a silicon nitride layer) is formed over the resulting structure of FIG. 2H. Then, a dry etch-back process is performed to etch the third mask layer 24 to form a covering structure 241 on sidewalls of the remaining second mask layer (FIG. 2J). Then, an etching process is performed to form trench structures in the epitaxial layer 202 of the substrate 20, where the trench structures are formed in the portion of the epitaxial layer 202 not covered by the remaining second mask layer 23 and not covered by the field oxide layer structure 210. Then the oxide layer 234 is removed (FIG. 2K). More particularly, as shown in FIG. 2K, the trench structures in the epitaxial layer 202 comprises at least one narrow trench 25 in device region (shown on left side of the dashed line) and a wide trench 25' in termination region (shown on right side of the dashed line). The width of the wide trench 25' is substantially larger than that of the narrow trench 25, and can be, for example, larger than 10 um). Then, as shown in FIG. 2L, a thermal oxide layer 251 (i.e. a trench oxide layer) is grown on the inner surface of the trench structures 25 and 25', and then a fourth mask layer 252 (e.g. a polysilicon layer) is formed within the trench structures 25 and 25' and formed on the field oxide layer structure 210 and on the remaining second mask layer 23.

Then, a dry etch-back process is performed to partially etch the fourth mask layer 252 until the level of the fourth mask layer 252, which is in the trench 25 of device region, is lower than the surface of the substrate 20 by a specified level (FIG. 2M). More particularly, after the dry etch-back process, the wide trench 25' in right side of. FIG. 2M has only fourth mask layer 252 remained on the inner side surfaces thereof, which is referred to trench polysilicon layer 252 in later description. The wide trench 25' does not have fourth mask layer 252 remained on the bottom face thereof, and the thermal oxide layer 251 is exposed on the bottom face thereof. Then, an etching process is performed to remove the silicon nitride layer 233 and the covering structure 241 (FIG. 2N). Then, an ion-implanting process is performed to dope the substrate with boron ions to form a deep doped region 260 in the lightly-doped N-type epitaxial layer 202 and at the location adjacent to the trench oxide layer 251 within the trench structure 25 (FIG. 2O). Then, a metal sputtering process or a metal evaporation process is performed to form a metal layer 27 on the polysilicon layer 252 within the trench structure 25 in the device region, the polysilicon layer 232 of the gate structure, the exposed oxide layer 251 within the wide trench 25', the trench polysilicon layer 252 within the wide trench 25' and the field oxide layer structure 210 (FIG. 2P).

In this embodiment, the metal layer 27 is exemplified as a metal sputtering layer 27 and comprises a first metal layer 271 and a second metal layer 272 as shown in FIG. 2P. The first metal layer 271 is made of titanium or titanium nitride. The second metal layer 272 is made of aluminum or other metal material. Moreover, after the metal sputtering layer 27 is formed, a rapid thermal nitridation process is performed to facilitate adhering the first metal layer onto the polysilicon layer 252 within the trench structure 25 in the device region, the polysilicon layer 232 of the gate structure, the exposed oxide layer 251 within the wide trench 25', the trench polysilicon layer 252 within the wide trench 25' and the field oxide layer structure 210.

Then, a photoresist layer is formed on the metal sputtering layer 27. A third photolithography process is performed to define a patterned photoresist zone 2731 and a photoresist-free zone 2730 of the photoresist layer (FIG. 2Q). An etching process is performed to partially remove the metal sputtering layer 27 not covered by the patterned photoresist zone 2731. After the remaining patterned photoresist zone 2731 is removed, the resulting structure of FIG. 2R is produced.

With reference to FIG. 2R, the MOS PN junction diode with wide trench termination structure mainly comprises two regions, namely a device structure (active structure) on left side and a wide trench termination structure. The wide trench termination structure mainly comprises semiconductor substrate 20 (with a heavily-doped N-type silicon layer 201 and a lightly-doped N-type epitaxial layer 202), a wide trench 25', an oxide layer 251 on inner bottom face of the wide trench 25', trench polysilicon layers 252 on two lateral inner faces of the wide trench 25' (the trench polysilicon layers 252 are also arranged on the oxide layer 251), and a metal layer 27. The metal layer 27 comprises a first metal layer 271 (made of titanium or titanium nitride) and a second metal layer 272 (made of aluminum or other metallic material). Moreover, the first metal layer 271 is arranged on the trench polysilicon layers 252 on two lateral inner faces of the wide trench 25', the oxide layer 251 on inner bottom face of the wide trench 25', and the field oxide layer structure 210. The second metal layer 272 is arranged on the first metal layer 271. When a reverse voltage is applied to the MOSFET PN junction diode with wide trench termination structure shown in FIG. 2R, the applied voltage is spread by the connection between the metal layer 27 and the trench polysilicon layers 252 on two lateral inner faces of the wide trench 25' and spread by the connection between the metal layer 27 and the oxide layer 251 on inner bottom face of the wide trench 25'. Therefore, the MOS PN junction diode with wide trench termination structure has enhanced reverse voltage tolerance.

Figure 3A:
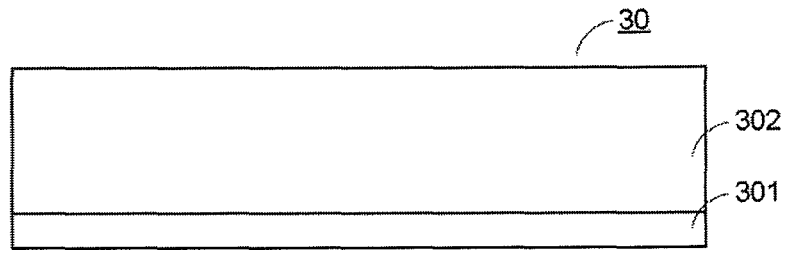
FIGS. 3A~3R schematically illustrate a method of manufacturing a semiconductor device with wide trench termination structure according to a second embodiment of the present invention.
Figure 3B:
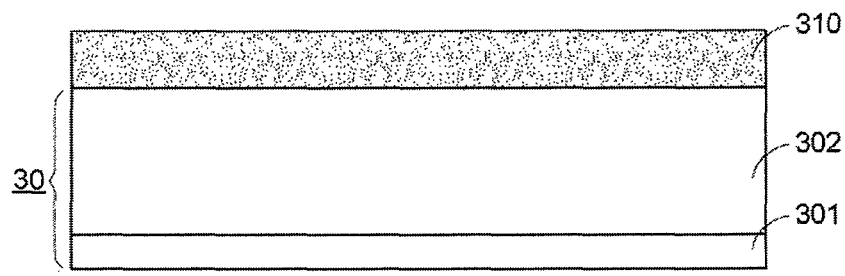
Figure 3C:
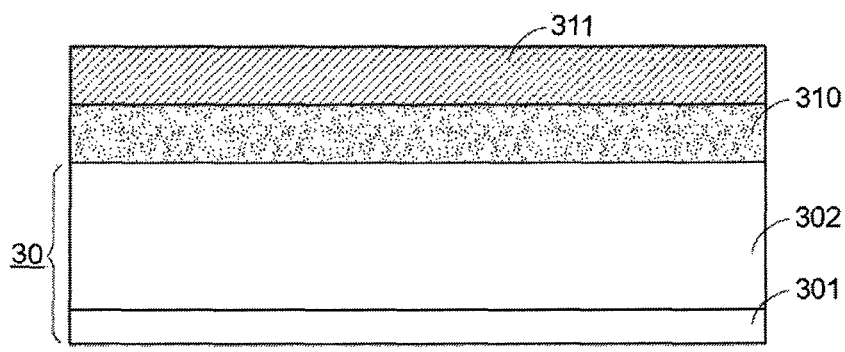
Figure 3D:
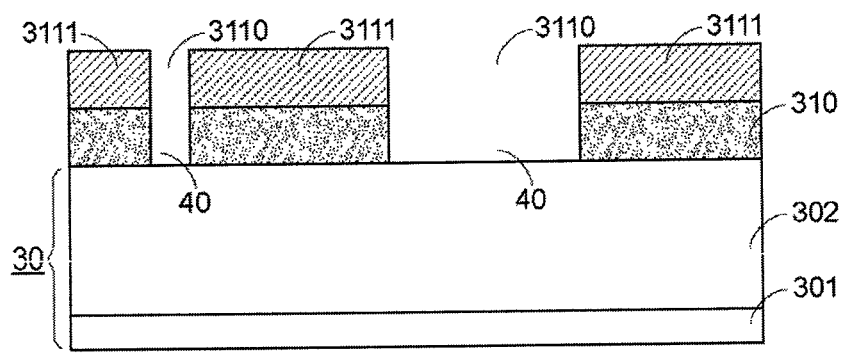
Figure 3E:
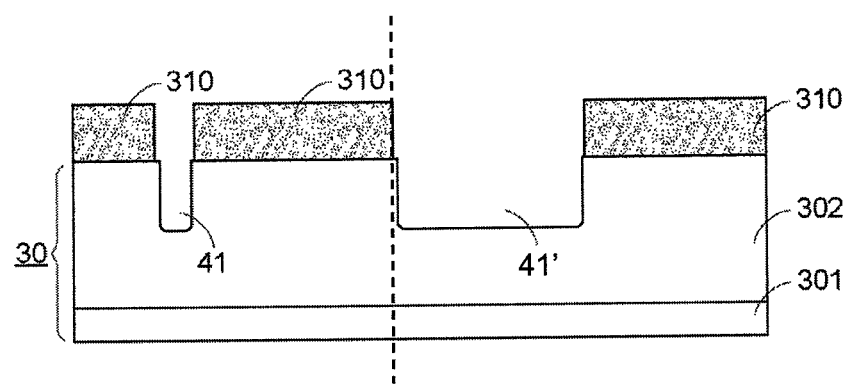
Figure 3F:
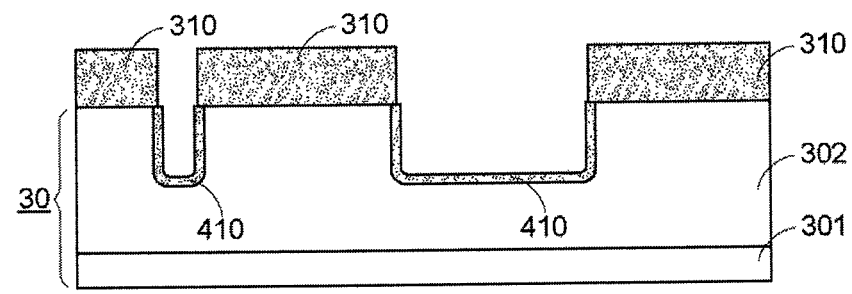
Figure 3G:
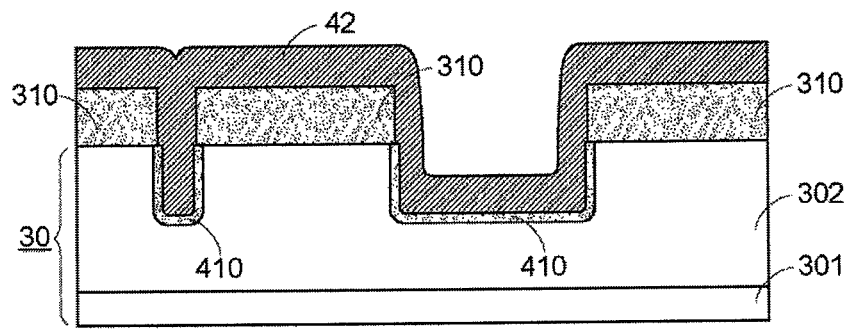
Figure 3H:
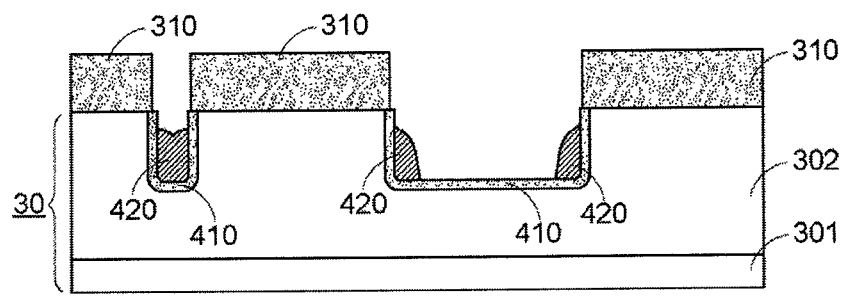
Figure 3I:
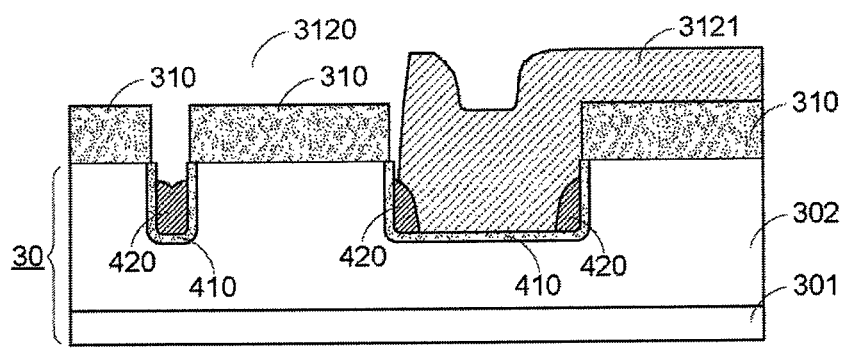
Figure 3J:
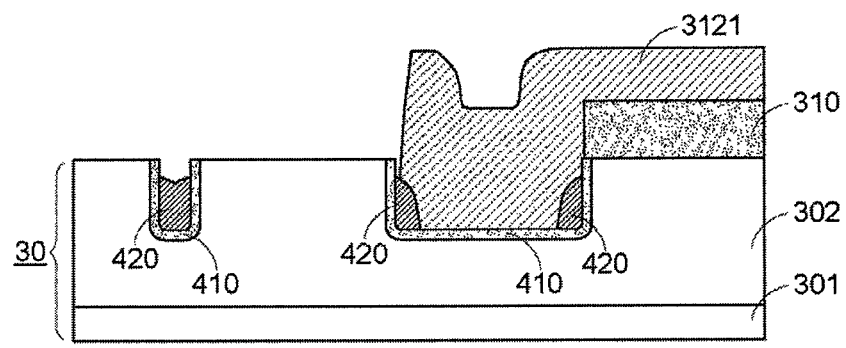
Figure 3K:
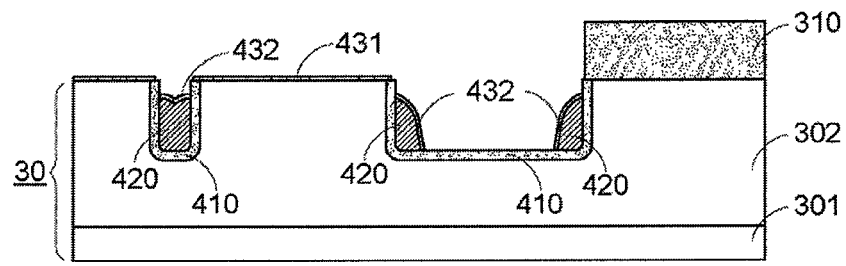
Figure 3L:
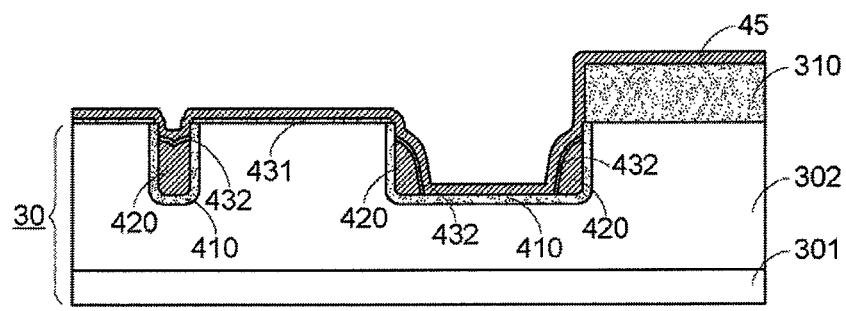
Figure 3M:
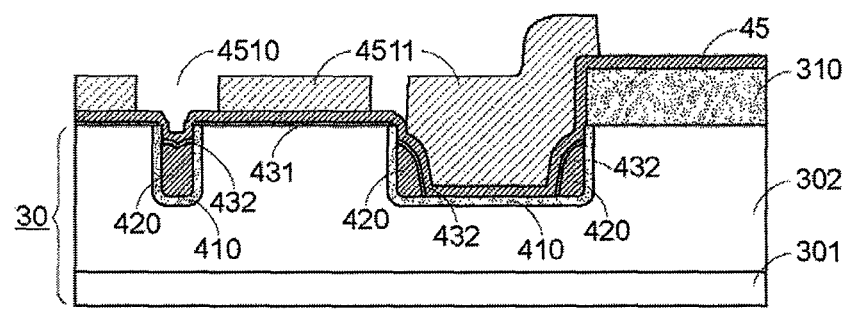
Figure 3N:
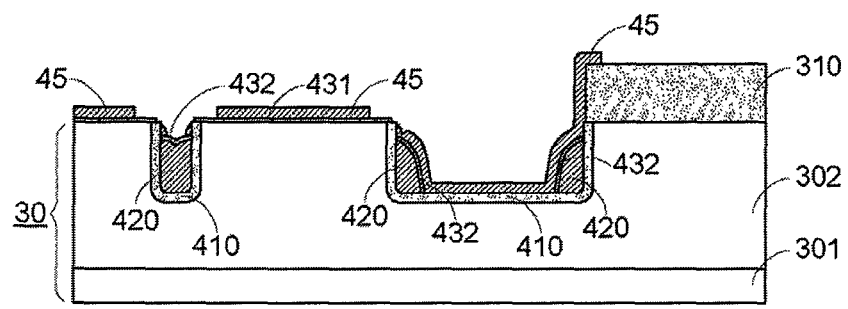
Figure 3O:
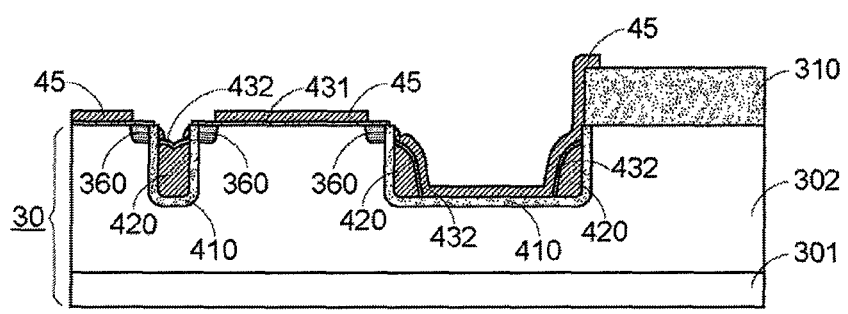
Figure 3P:
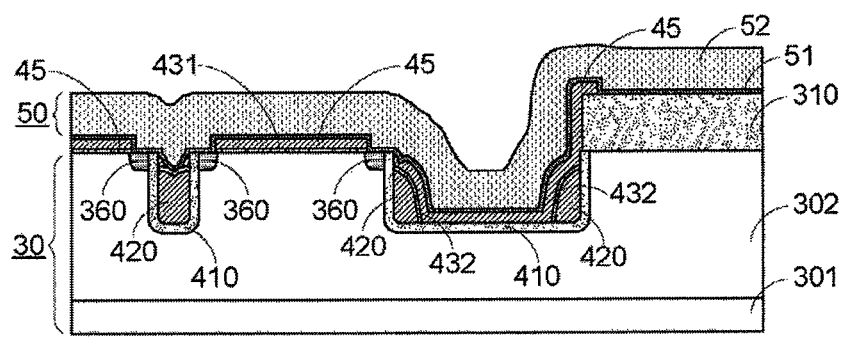
Figure 3Q:
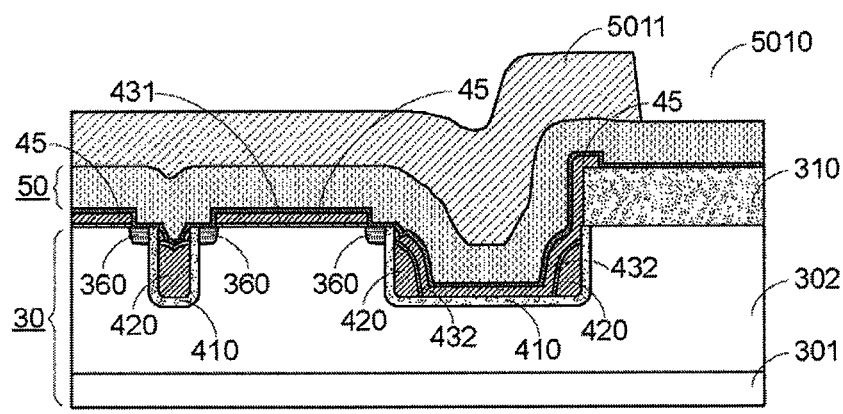
Figure 3R:
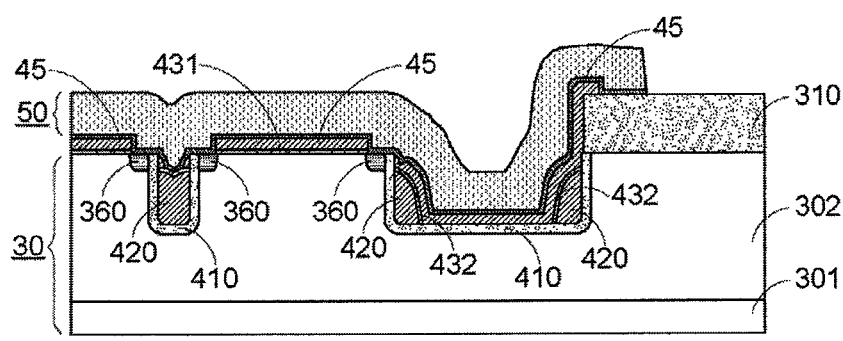

Please refer to FIGS. 3A~3R, which schematically illustrate a method of manufacturing a semiconductor device with wide trench termination structure according to a second embodiment of the present invention. The semiconductor device is exemplified with MOS PN junction diode. However, it should be noted that the wide trench termination structure of the present invention can also be applied to other semiconductor devices, such as Schottky diode, MOSFET device, or IGBT (Insulated Gate Bipolar Transistor), demanding termination structure. Therefore, the scope of the disclosure is not limited by the specific example.

Firstly, as shown in FIG. 3A, a substrate 30 with a heavily-doped N-type silicon layer 301 (N+ silicon layer) and a lightly-doped N-type epitaxial layer (N– epitaxial layer) 302 is provided. Then, as shown in FIG. 3B, a first mask layer 310 (an oxide layer) is grown on the substrate 30 by thermal oxidation. Then, a photoresist layer 311 is formed on the first mask layer 310 (FIG. 3C). Then, a first photolithography process is performed to define a patterned photoresist zone 3111 and a photoresist-free zone 3110 of the photoresist layer 311 (FIG. 3D). A dry etching process is performed to remove the first mask layer 310 not covered by the patterned photoresist zone 3111 to form a concave structure 40 in the first mask layer 310. Then, the remaining patterned photoresist zone 3111 is removed, and an etching process is performed to partially remove the substrate not covered by the first mask layer 310 to form trench structures in the substrate 302 (FIG. 3E). More particularly, as shown in FIG. 3E, the trench structures in the epitaxial layer 202 comprises at least one narrow trench 41 in device region (shown on left side of the dashed line) and a wide trench 41' in termination region (shown on right side of the dashed line). The width of the wide trench 41' is substantially larger than that of the narrow trench 41, and can be, for example, larger than 10 um).

Then, as shown in FIG. 3F, a first oxide layer 410 is grown on the inner surfaces of the trenches 41 and 41', and the first oxide layer 410 is also referred to as trench oxide layer for the sake of description. Then, a second mask layer 42 e.g. a polysilicon layer) is formed on the first mask layer 310 and the first oxide layer 410 (FIG. 3G). Then, a dry etch-back process is performed to etch the second mask layer 42 until the surface of the remain polysilicon layer 420 within the narrow trench 41 in device region is lower than the surface of the N-type epitaxial layer 302 by a predetermined depth (such as about 3000 angstroms see FIG. 3H). More particularly, after the dry etch-back process, the wide trench 41' in right side of FIG. 3H has only remain polysilicon layer 420 remained on the inner side surfaces thereof, which is referred to trench polysilicon layer 420 in later description.

Then, a second photolithography process is performed to define a patterned photoresist zone 3121 and a photoresist-free zone 3120 on the substrate 30 (FIG. 3I). By using the patterned photoresist zone 3121 as an etch mask, an etching process is performed to remove the first mask layer 310 not covered by the patterned photoresist zone 3121 (FIG. 3J). After the remaining patterned photoresist zone 3121 is removed, the substrate 30 is cleaned. Then, by thermal oxidation, a gate oxide layer 431 is formed on the substrate 30 in device region, and an oxide layer 432 is formed on the surface of the trench polysilicon layer 420 (FIG. 3K). Then, as shown in FIG. 3L, a third mask layer 45 (e.g. a polysilicon layer) is formed over the gate oxide layer 431, the trench oxide layer 432 overlying the polysilicon layer 420, the exposed trench oxide layer 410 and the field oxide layer structure 310.

Then, a third photolithography process is performed to define a patterned photoresist zone 4511 and a photoresist-free zone 4510 on the substrate 30 (FIG. 3M). Then, an etching process is performed to remove the third mask layer (polysilicon layer) 45 not covered by the patterned photoresist zone 4511 by using the patterned photoresist zone 4511 as an etch mask (FIG. 3N). After the remaining patterned photoresist zone 4511 is removed, an ion-implanting process is performed to dope the substrate with a boron ion and a rapid thermal annealing process is performed. Consequently, a deep doped region 360 is formed in the lightly-doped N-type epitaxial layer 302 and at the location adjacent to the trench oxide layer 410 (FIG. 3O).

Then, the substrate is cleaned, and an etching process is performed to partially remove the gate oxide layer 431 overlying the deep doped region 360 and the oxide layer 432 overlying the polysilicon layer 420. Then, a metallic process (for example, sputtering or evaporation process) is performed to form a metal layer 50 on the polysilicon layer 45, the deep doped region 360 and the field oxide layer structure 310 (FIG. 3P). In this embodiment, the metal layer 50 is exemplified as a metal sputtering layer 50 and comprises a first metal layer 51 and a second metal layer 52. The first metal layer 51 is made of titanium or titanium nitride. The second metal layer 52 is made of aluminum or other metal material.

Moreover, after the metal sputtering layer 50 is formed, a rapid thermal nitridation process is performed to facilitate adhering the first metal layer 51 onto the polysilicon layer 45, the deep doped region 360 and the field oxide layer structure 310. Then, a photoresist layer is formed on the metal sputtering layer 50. A fourth photolithography process is performed to define a patterned photoresist zone 5011 and a photoresist-free zone 5010 of the photoresist layer (FIG. 3Q). An etching process is performed to partially remove the metal sputtering layer 50 not covered by the patterned photoresist zone 5011. After the remaining patterned photoresist zone 5011 is removed, the resulting structure of FIG. 3R is produced.

With reference to FIG. 3R, the MOS PN junction diode with wide trench termination structure mainly comprises two regions, namely a device structure on left side and a wide trench termination structure. The wide trench termination structure mainly comprises the substrate 30 (with a heavily-doped N-type silicon layer 301 and a lightly-doped N-type epitaxial layer 302), the wide trench 41', the oxide layer 410 on inner face of the wide trench 41', the trench polysilicon layers 420 on two lateral inner faces of the wide trench 41' (the polysilicon layers 420 are also arranged on the oxide layer 410), the surface oxide layer 432 on the outer surface of the polysilicon layers 420), the polysilicon layer 45 on the surface oxide layer 432 and the oxide layer 410, and the metal layer 50 covering the polysilicon layer 45.

The metal layer 50 comprises a first metal layer 51 (made of titanium or titanium nitride) and a second metal layer 52 (made of aluminum or other metal material). When a reverse voltage is applied to the MOSFET PN junction diode with wide trench termination structure shown in FIG. 3R, the applied voltage is spread by the connection between the metal layer 50 and the polysilicon layer 45. Therefore, the MOS PN junction diode with wide trench termination structure has enhanced reverse voltage tolerance.

From the above description, the present invention provides a trench isolation MOS P-N junction diode device (i-MOS Rectifier) and a manufacturing method thereof The trench isolation MOS P-N junction diode device is a combination of an N-channel MOS structure and a lateral P-N junction diode, wherein a polysilicon-filled trench oxide layer is buried in the P-type structure to replace the majority of the P-type structure. In a forward mode, the N-channel MOS structure and the P-N junction diode are connected with each other in parallel. Under this circumstance, like the Schottky diode, the trench isolation MOS P-N junction diode device has low forward voltage drop and rapid switching speed. Whereas, in a reverse mode, the leakage current is pinched off and the N-channel is shut off by the polysilicon-filled trench oxide layer and the depletion region of the lateral P-N junction diode, so that the trench isolation MOS P-N junction diode device (i-MOS Rectifier) has low leakage current. In addition, since the polysilicon-filled trench oxide layer is buried in the P-type structure to replace the majority of the P-type structure, the area of the P-type structure is reduced and the influence of the carrier effect is reduced. Under this circumstance, the trench isolation MOS P-N junction diode device has shorter reverse recovery time. As a consequence, the trench isolation MOS P-N junction diode device (i-MOS Rectifier) of the present invention has the benefits of the Schottky diode and the P-N junction diode. That is, the trench isolation MOS P-N junction diode device of the present invention has rapid switching speed, low forward voltage drop, low reverse leakage current and short reverse recovery time.

Please refer to FIGS. 4A~4J, which schematically illustrate a method of manufacturing a semiconductor device with wide trench termination structure according to a third embodiment of the present invention. The semiconductor device is exemplified with MOSFET PN junction diode.

Figure 4A:
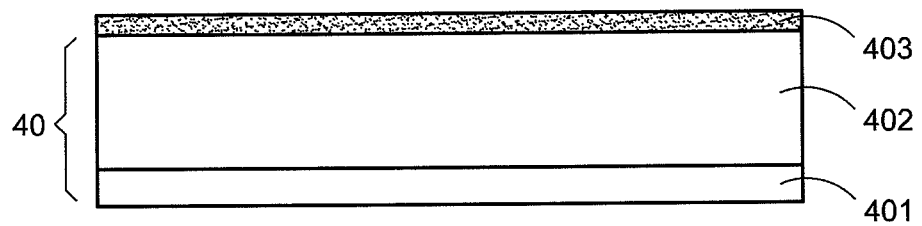
FIGS. 4A~4J schematically illustrate a method of manufacturing a semiconductor device with wide trench termination structure according to a third embodiment of the present invention.
Figure 4B:
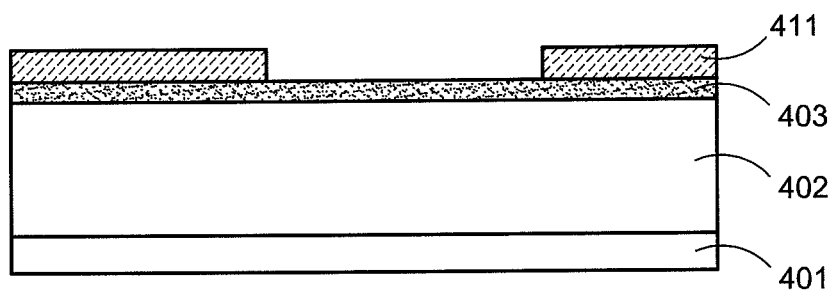
Figure 4C:
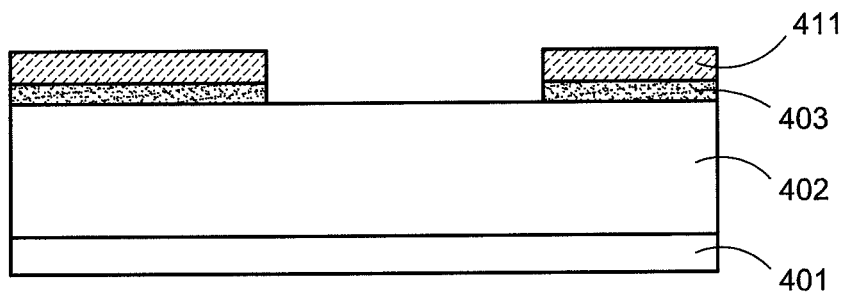
Figure 4D:
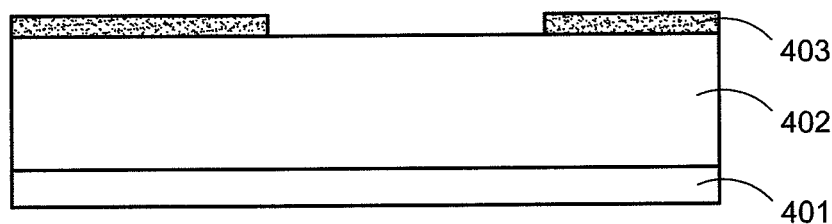
Figure 4E:
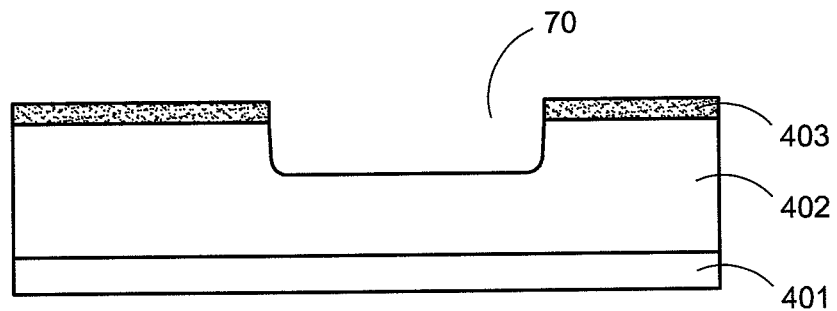
Figure 4F:
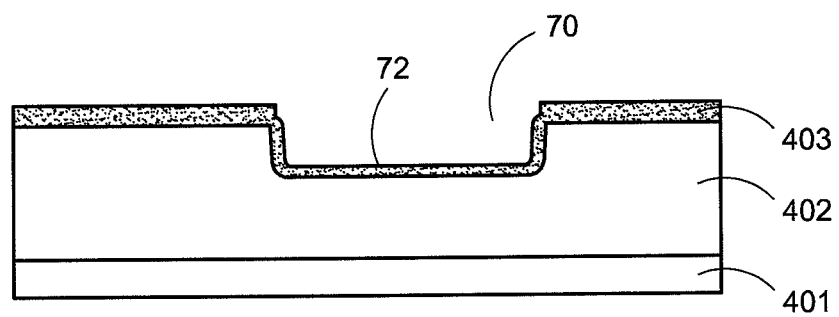
Figure 4G:
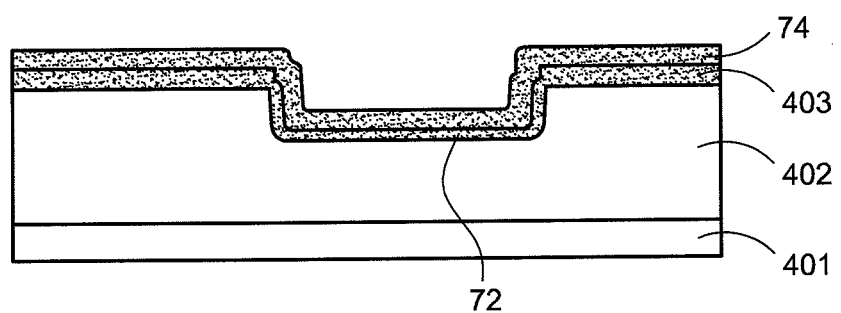

Firstly, as shown in FIG. 4A, a semiconductor substrate 40 with a heavily-doped N-type silicon layer 401 (N+ silicon layer) and a lightly-doped N-type epitaxial layer (N– epitaxial layer) 402 is provided. Then, as also shown in FIG. 4A, a first mask layer 403 (a field oxide layer) is grown on the substrate 40 by thermal oxidation. Then, a photoresist layer pattern 411 is formed on the first mask layer 403 by a first photolithography process (FIG. 4B). The photoresist layer pattern 411 is used as a mask and a dry etching process is used to remove the portion of the first mask layer 403 not covered by the photoresist layer pattern 411 (FIG. 4C). After removing the photoresist layer pattern 411 (FIG. 4D), the remaining first mask layer 403 (which is referred to as a field oxide layer structure) is used as a mask to conduct another dry etching on the resulting structure and then a wide trench 70 is defined on the lightly-doped N-type epitaxial layer 402 (FIG. 4E). The wide trench 70 is located at the termination structure region of the MOSFET PN junction diode, and the width of the wide trench 70 is, for example, larger than 10 um.

After the wide trench 70 is defined, an optional trench rounding process can be performed on bottom face and lateral inner faces of the wide trench 70 in order to remove the rough edges of the wide trench 70 caused by etching process. The optional trench rounding process can be performed by following ways: (1) a dry etching is performed on the wide trench 70 to remove surface portion of the trench (for example, remover several hundreds of angstrom). The relatively thin etching process can trim the surface of the wide trench 70. (2) afterward, a thin oxide layer (serving as a sacrificial oxide) is formed on bottom face and lateral inner faces of the wide trench 70 and then the thin oxide layer is removed. Namely, by forming and then removing the thin oxide layer, the surface of the wide trench 70 can be trimmed.

Figure 4H:
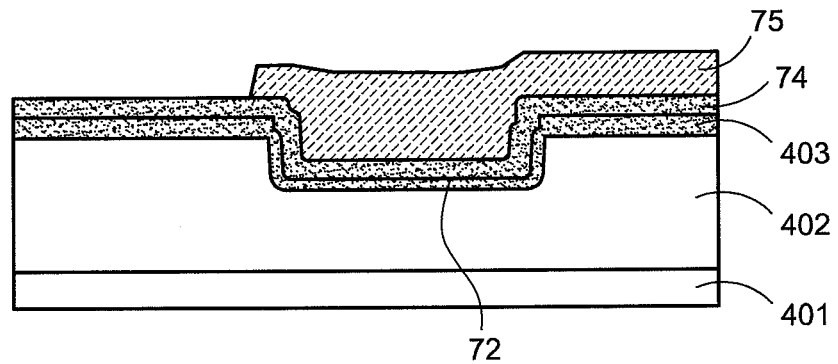
Figure 4I:
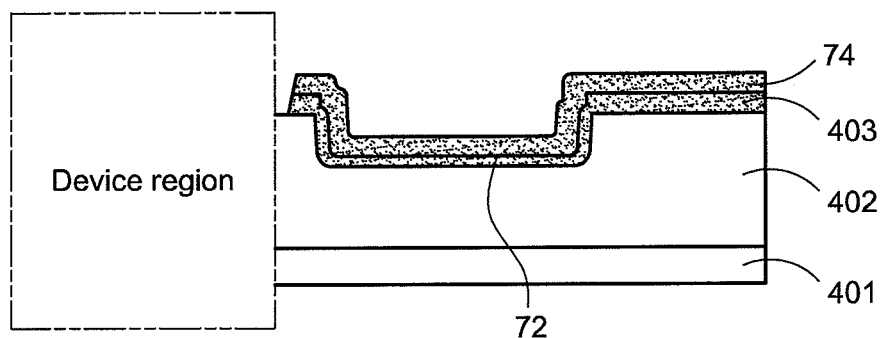

Afterward, a thermal oxidation process is performed on the resulting structure to form a thermal oxide layer 72 (FIG. 4F), then a TEOS (Tetraethoxysilane) oxide layer 74 is formed in the resulting structure (FIG. 4G), wherein the thickness of the TEOS oxide layer 74 can be, but not limited to, more than 2000 angstroms. Moreover, as shown in FIG. 4H, a photoresist layer 75 is formed to cover the wide trench 70. Afterward, device-forming process is conducted on the resulting structure, and those process steps can be similar to those steps mentioned in the previous two examples. Moreover, the devices in the device region may contain a plurality narrow trench with width narrower than that of the wide trench 70. The termination characteristic of the components in the wide trench 70 is not influenced by the device-forming process in device region because the wide trench 70 is covered by the photoresist layer 75. Afterward, a metal sputtering or a metal evaporation process is performed to form a metal layer (not shown) after the processes in device region are finished and the photoresist layer 75 is removed (FIG. 4I).

Figure 4J:
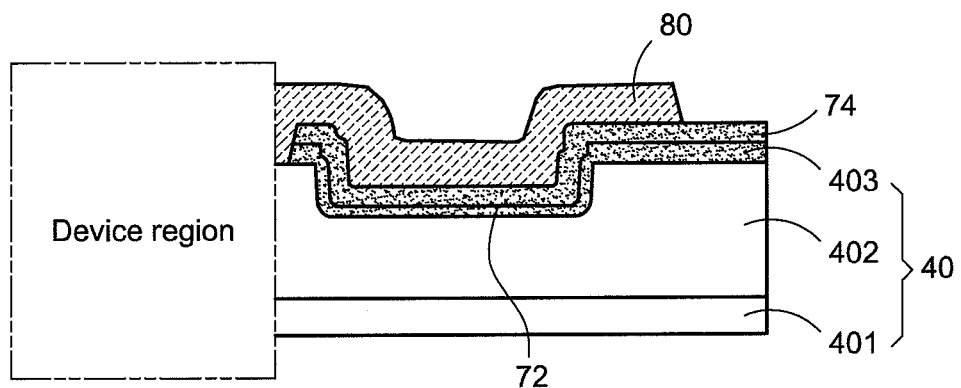

Finally, a photolithography process is performed to remove partial metal layer near the edge of the wide trench 70 to form the resulting structure shown in FIG. 4J. The wide trench termination structure comprises the semiconductor substrate 40 (with a heavily-doped N-type silicon layer 401 and a lightly-doped N-type epitaxial layer 402), the wide trench 70 defined on surface of the semiconductor substrates, the field oxide layer structure 403 on the surface of the substrate 40 and outside the wide trench 70, the thermal oxide layer 72 within the wide trench 70, the TEOS oxide layer 74 arranged on the thermal oxide layer 72, and metal layer 80 covering the TEOS oxide layer 74. When a reverse voltage is applied to the metal layer 80 of the device shown FIG. 4J, the voltage can be spread through the metal layer 80 and the TEOS oxide layer 74, thus enhancing the reverse voltage tolerance for the semiconductor device.

Moreover, the above-mentioned metal layer 80 may be, similar to the previous two examples, consisted of a first metal layer (made of titanium or titanium nitride) and a second metal layer (made of aluminum or other metal material). After the metal etching process, an optional sintering process can be conducted to enhance the sealing between the metal layer and the underlying device and the sealing between the metal layer and the TEOS oxide layer 74.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A wide trench termination structure for semiconductor device, the semiconductor device comprising a semiconductor substrate, a device region and the wide trench termination structure, the device region comprising a plurality of narrow trenches, the wide trench termination structure comprising:
    a wide trench defined on the semiconductor substrate and a width of the wide trench being larger than a width of the narrow trench;
    an oxide layer formed on inner face of the wide trench, wherein the inner face comprises an inner side face and a bottom face;
    at least one trench polysilicon layer formed on an outer face of the oxide layer and corresponding to the inner side face of the wide trench;
    a metal layer formed on the oxide layer not covered by the trench polysilicon layer and on the trench polysilicon layer, and
    a field oxide layer structure arranged on the semiconductor substrate and outside the wide trench structure;
    wherein the metal layer is in direct contact with a portion of the oxide layer formed on the bottom face of the wide trench, and
    wherein the trench polysilicon layer does not extend to a center portion of the bottom face of the wide trench.

2. The wide trench termination structure in claim 1, wherein the semiconductor substrate comprises a heavily-doped silicone layer and a lightly-doped epitaxial layer.

3. The wide trench termination structure in claim 1, wherein the metal layer comprises a first metal layer and a second metal layer arranged on the first metal layer.

4. The wide trench termination structure in claim 3, wherein the first metal is made of titanium or titanium nitride, the second metal layer is made of aluminum.

5. The wide trench termination structure in claim 1, wherein the semiconductor device is metal oxide semiconductor (MOS) PN junction diode, Schottky diode, MOSFET device or insulated gate bipolar transistor (IGBT).

6. A wide trench termination structure for semiconductor device, the semiconductor device comprising a semiconductor substrate, a device region and the wide trench termination structure, the device region comprising a plurality of narrow trenches, the wide trench termination structure comprising:
    a wide trench defined on the semiconductor substrate and a width of the wide trench being larger than a width of the narrow trench;
    a thermal oxide layer formed on an inner face of the wide trench;
    a tetraethoxysilane (TEOS) oxide layer formed on the thermal oxide layer and being in direct contact with the thermal oxide layer;
    a metal layer arranged on the TEOS oxide layer, and
    a field oxide layer structure arranged on the semiconductor substrate and outside the wide trench structure, wherein the TEOS oxide layer extends to the field oxide layer structure.

7. The wide trench termination structure in claim 6, wherein the semiconductor substrate comprises a heavily-doped silicone layer and a lightly-doped epitaxial layer.

8. The wide trench termination structure in claim 6, wherein the metal layer comprises a first metal layer and a second metal layer arranged on the first metal layer.

9. The wide trench termination structure in claim 8, wherein the first metal is made of titanium or titanium nitride, the second metal layer is made of aluminum.

10. The wide trench termination structure in claim 6, wherein the semiconductor device is metal oxide semiconductor (MOS) PN junction diode, Schottky diode, MOSFET device or insulated gate bipolar transistor (IGBT).

* * * * *